United States Patent

[11] 3,585,408

[72] Inventor Alton O. Christensen
Houston, Tex.
[21] Appl. No. 842,527
[22] Filed July 17, 1969
[45] Patented June 15, 1971
[73] Assignee Shell Oil Company
New York, N.Y.

[54] MOSFET CIRCUIT FOR EXTENDING THE TIME DURATION OF A CLOCK PULSE
13 Claims, 3 Drawing Figs.

[52] U.S. Cl. .......... 307/267, 307/304, 328/58
[51] Int. Cl. .......... H03k 1/18
[50] Field of Search .......... 307/267, 304, 293, 251, 269, 273; 328/58, 185; 330/35

[56] References Cited

OTHER REFERENCES

Hines, "Combined Single-shot and Delay," I.B.M. TECHNICAL DISCLOSURE BULLETIN, July 1967, pp. 184, 185. 307/273

*Primary Examiner*—Stanley T. Krawczewicz
*Attorneys*—Theodore E. Bieber and J. H. McCarthy

ABSTRACT: A MOSFET circuit is disclosed which is capable of generating a pulse of extended duration from a given clock pulse. The circuit includes regenerative mans effective at the end of the pulse of extended duration in order to provide a sharp termination thereof. A method of and means for controlling the amount by which the pulse duration is extended by controlling a voltage applied to the circuit are described.

INVENTOR.
ALTON O. CHRISTENSEN
BY
Mellin, Moore & Weissenberger
ATTORNEYS

MOSFET CIRCUIT FOR EXTENDING THE TIME DURATION OF A CLOCK PULSE

BACKGROUND OF THE INVENTION

This invention relates to metal oxide silicon field effect transistor (MOSFET) circuits which utilize timed electrical pulses or "clocks" in their operation and particularly to a novel MOSFET circuit element by which a timing or clock pulse of given time duration may be used to generate a further clock pulse of increased time duration.

Metal oxide silicon field effect transistor (MOSFET) circuits have been developed for a wide variety of applications in digital systems. In most of such applications, as for example in a random access memory system, a number of clocks are required to synchronize the various electrical functions of the system. Such clocks comprise carefully designed circuitry that must be capable of generating pulses of electrical energy having a precisely controlled frequency and pulse duration. The ideal clock pulse shape is a square wave since it is used both for beginning a function of the system at a precise point in time and for terminating such function at a precise point in time. In many systems a number of different clocks are required, often all having precisely the same starting time but each having a different duration. Thus, a number of separate circuits, one for generating each of the different clocks together with appropriate leads for connecting each of the clocks to each of the metal oxide silicon chips of the system, were required.

SUMMARY OF THE INVENTION

The present invention provides a MOSFET circuit by which a clock of given frequency and pulse duration is used to generate a further clock of the same frequency but longer pulse duration. The circuit of this invention may be formed on a metal oxide silicon chip and could, of course, be formed on each chip of a given system in order to minimize the additional expense and complexity introduced by the provision of multiple clocks for the system together with the leads associated therewith. As will be seen, when the circuit of this invention and its operation are more fully described, it is possible to change or vary the duration of the clock pulse generated by such circuit by simply changing or varying its operating voltage.

Thus it is an object of this invention to provide a circuit capable of generating from a given clock a further clock having the same frequency but a longer pulse duration than the given clock.

It is another object of this invention to provide a circuit capable of generating from a given clock a further clock having the same frequency but a longer pulse duration than the given clock and which will enable the length of the pulse of the further clock to be changed or varied by a mere change in, or variation of, the voltage applied to such circuit.

It is a further object of this invention to provide a circuit of the type described which may be formed on a metal oxide silicon chip.

DESCRIPTION OF THE PREFERRED EMBODIMENT

Figure 1:
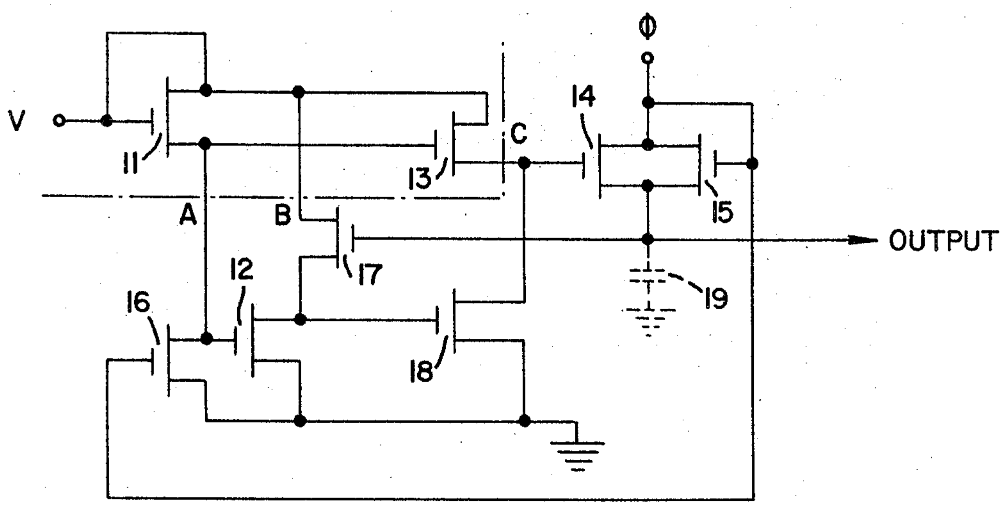
FIG. 1 is a schematic representation of a preferred embodiment of a circuit in accordance with this invention.

In the embodiment of a circuit according to this invention shown in FIG. 1, a given clock at input $\phi$, having a given frequency and pulse duration is connected to the output line of the circuit through a pair of MOSFETS 14 and 15 which have their sources connected together and to said given clock input $\phi$. The drains of said MOSFETs 14 and 15 are connected together and to said output line. The gate of one 15 of the pair of MOSFETs, is also connected to said given clock input $\phi$. Thus, the initiation of a pulse from the clock at input $\phi$ will enable MOSFET 15 resulting in the simultaneous application of such clock pulse to the output line, charging its inherent capacitance (indicated schematically by dotted lines 19). The time constant for charging the capacitance 19 should be as low as is practical in order to preserve the squareness of the leading edge of the clock pulse. According to this invention MOSFET 14 will also be enabled at the start of the clock pulse to help charge the capacitance 19 of the output line, as is described below, thus helping to preserve the squareness of the leading edge of the pulse impressed on the output line.

The gate of the other 14 of the pair of MOSFETs is connected to the source of MOSFET 13, the drain of which is connected to a voltage input V. In this embodiment of a circuit in accordance with this invention the voltage at V is negative and may be variable for purposes to be described hereinafter. The gate of MOSFET 13 is connected to the source of MOSFET 11, the drain of which is connected to the voltage input V. The gate of MOSFET 11 is also connected to the voltage input V. Thus, the voltage at input V will enable MOSFET 11 resulting in the application of such voltage to the gate of MOSFET 13 rendering it conductive. Since MOSFET 13 is connected between the gate of MOSFET 14 and the voltage input V it will be seen that the voltage at V will be applied to the gate of MOSFET 14 making it available to assist MOSFET 15 in charging the output line when a pulse of the clock is applied at input $\phi$.

As shown in FIG. 1, a MOSFET 16 connected from the gate of MOSFET 13 to ground and having its gate connected to clock input $\phi$ will discharge the gate of MOSFET 13 upon application of the clock pulse. The discharge of the gate of MOSFET 13 will cause it to cease conducting and thus isolate the gate of MOSFET 14 from the voltage at input V. However, since the gate of MOSFET 14 will remain charged, it would thus remain in a conducting state and would be available to discharge the capacitance 19 of the output line immediately upon cessation of the clock pulse, but for the remaining elements of the circuit.

In order to cause the capacitance 19 of the output line to remain charged after the clock pulse has ceased and thus provide a pulse of increased duration, a MOSFET 18 is provided having its drain connected to the gate of MOSFET 14 and its source connected to ground. The gate of MOSFET 18 is connected to the source of MOSFET 17 and the drain of MOSFET 17 is connected to the voltage input V. The gate of MOSFET 17 is connected to the output line. Thus, the charge on the capacitance 19 of the output line is applied to the gate of MOSFET 17 rendering it conductive and applying the voltage present at input V to the gate of MOSFET 18. The voltage thus applied to the gate of MOSFET 18 will render it conductive resulting in the discharge of the gate of MOSFET 14. The time constant for the discharge of the gate of MOSFET 14 is made short enough to render MOSFET 14 nonconducting during the clock pulse; so that, when such clock pulse ceases and the clock input $\phi$ returns to grounded condition, the capacitance 19 of the output line will be isolated from the clock input $\phi$ and its charge preserved.

In order to terminate the pulse appearing at the output of the circuit when the desired pulse duration has been attained MOSFET 14 is again rendered conductive, as described below, and the capacitance 19 of the output line is discharged through MOSFET 14 to the grounded clock input $\phi$. This is accomplished by means of MOSFET 12, the drain of which is connected to the gate of MOSFET 18 and the source of which is connected to ground. The gate of MOSFET 12 is connected to the source of MOSFET 11 and thus to the voltage at input V through MOSFET 11 in parallel with the drain of MOSFET 16 and the gate of MOSFET 13. The source of MOSFET 16 is connected to ground and the gate of MOSFET 16 is connected to clock input Φ. Thus, it will be seen that, during the clock pulse, which enables MOSFET 16, the gate of MOSFET 12 as well as the gate of MOSFET 13 will be discharged through MOSFET 16 to ground. However, immediately upon cessation of the clock pulse the gate of MOSFET 12 as well as the gate of MOSFET 13 will begin to be charged by the voltage at input V. When such charge is sufficient to enable MOSFET 12 to conduct, it will discharge the gate of MOSFET 18 thus tending to isolate the gate of MOSFET 14 from ground. Similarly, when such charge is sufficient to enable MOSFET 13 it will again connect the gate of MOSFET 14 to the voltage at input V tending to charge the gate of MOSFET 14 and render it conductive so that it will tend to discharge the capacitance 19 of the output line. A regenerative feedback loop which will increase the rate at which such effects occur is provided through MOSFET 17 by virtue of the fact that MOSFET 17 is connected in series with MOSFET 12 between input V and ground and the fact that the gate of MOSFET 17 is connected to the output line. It will be seen that the discharge of the capacitance 19 of the output line will reduce the charge on the gate of MOSFET 17 thus tending to render it nonconductive and isolate the gate of MOSFET 18 from the voltage at input V. Since MOSFET 12 is simultaneously tending to discharge the gate of MOSFET 18 the effects of MOSFETs 17 and 12 are additive and MOSFET 18 rapidly becomes nonconducting resulting in a more rapid charging of the gate of MOSFET 14. This, in turn, results in an increase in the rate of discharge of capacitance 19 and a corresponding reduction of the charge on the gate of MOSFET 17 thus closing the regenerative loop.

Figure 2:
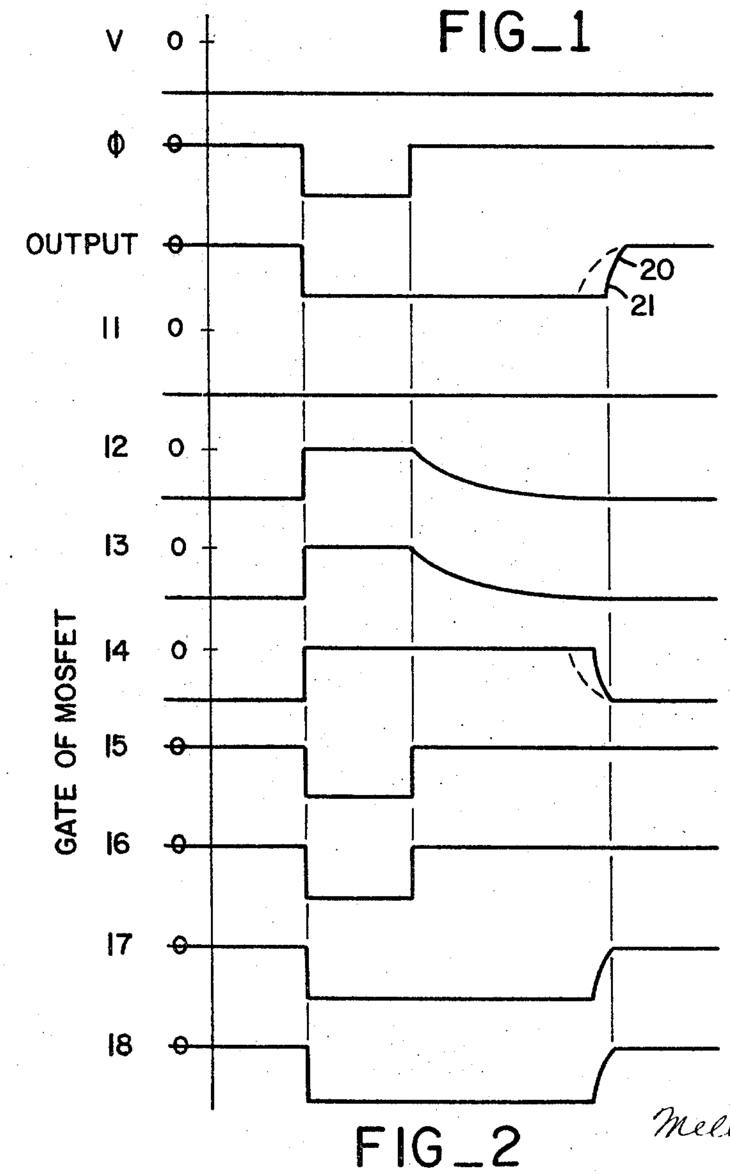
FIG. 2 is the timing diagram for the embodiment shown in FIG. 1 showing the voltages appearing at the inputs, the gates of the MOSFETS, and the output thereof.

The nature and operation of the circuit in accordance with this invention will be more fully understood by following the timing diagram, as shown in FIG. 2, of the operational cycle of the embodiment of FIG. 1. It will be understood that the term "MOSFET" as used herein in connection with the embodiment of FIG. 1 means a *p*-type device operating in the enhancement mode. Thus, the voltages depicted in FIG. 2 are shown as negative with respect to ground.

As shown, the voltage appearing at input V may be a constant negative voltage resulting in a constant negative charge on the gate of MOSFET 11. Since MOSFET 11 will be enabled by such charge it will connect the gates of MOSFETs 12 and 13 to the voltage at input V charging them as indicated. The charge on the gate of MOSFET 13 will render it conductive enabling the voltage at input V to charge the gate of MOSFET 14. MOSFETs 15, 16, 17 and 18 are all nonconductive immediately prior to a clock pulse at input Φ as indicated, thus the circuit is in a stable condition. As will be explained more fully hereinafter, the time required for the charging of the gates of MOSFETs 12 and 13 determines the amount by which the duration of a given clock pulse is extended, however, at the beginning of the cycle it is assumed that such charging has already occurred.

The appearance of a clock pulse at input Φ immediately begins to charge the capacitance 19 of the output line through MOSFET 14 which has been enabled as described above. Since the clock pulse also enables MOSFET 15 by charging its gate as indicated such capacitance 19 is charged through both MOSFETs 14 and 15 in parallel at the beginning of the clock pulse tending to preserve the squareness of the leading edge thereof in the output pulse. The clock pulse also enables MOSFET 16 by charging its gate. Although a very rapid charging of the gate of MOSFET 16 is indicated, it is not necessary since the function of MOSFET 16 is to discharge the gates of MOSFETs 12 and 13 to ground during the clock pulse. It will be understood that the rate of discharge of the gates of MOSFETs 12 and 13 also need not be as rapid as indicated. The discharge of the gate of MOSFET 12 will isolate the gate of MOSFET 18 from ground and the discharge of the gate of MOSFET 13 will isolate the gate of MOSFET 14 from the voltage at input V as discussed hereinabove. The charging of the capacitance 19 of the output line will also charge the gate of MOSFET 17 as indicated, thus enabling MOSFET 17. When enabled, MOSFET 17 connects the gate of MOSFET 18 to the voltage at input V thus charging it as indicated and enabling MOSFET 18. When enabled, MOSFET 18 connects the gate of MOSFET 14 to ground discharging it as indicated. Although the charging of the gate of MOSFET 17 will inherently correspond to the leading edge of the clock pulse, it is not necessary that the charging of the gate of MOSFET 18 and the discharging of the gate of MOSFET 14 be as rapid as indicated. It is only necessary that such charging and discharging, respectively, occur during the clock pulse. At this point the circuit is again in a stable condition so long as the clock pulse continues.

Upon cessation of the clock pulse the gates of MOSFETs 15 and 16 will be discharged, as indicated, through the clock input Φ which will return to ground. The capacitance 19 of the output line will thus be isolated from the input Φ both by MOSFET 15 and by MOSFET 14 and it will remain charged, as indicated, until MOSFET 14 is again enabled as described below.

As soon as the gate of MOSFET 16 has been discharged it will become nonconducting and the gates of MOSFETs 12 and 13 will begin to be charged through MOSFET 11 by the voltage at input V. As indicated, the time required for the gates of MOSFETs 12 and 13 to be charged to threshold voltage is of substantial duration and it is such charging time which determines the amount by which the circuit will extend the duration of the clock pulse in accordance with this invention. The length of such charging time is determined by the Resistance-Capacitance (RC) time constant of the circuit formed by the on-resistance of MOSFET 11 and the capacitance of the gates of MOSFETs 12 and 13. The amount of the voltage at input V will also tend to inversely affect such time constant, which tendency is enhanced by the inclusion of MOSFET 11 in this embodiment of a circuit in accordance with this invention, as described below.

Figure 3:
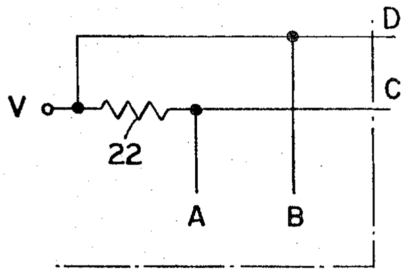
FIG. 3 is a schematic representation of a modification which may be made in accordance with this invention in the portion of the circuit shown in FIG. 1 above and to the left of the dotted line, corresponding electrical connections in the two embodiments being indicated at A, B, C and D of the two figures respectively.

It will be understood that a resistive means 22 could be substituted for MOSFET 11, as shown in FIG. 3, in accordance with this invention, and that by proper selection of the resistance of such resistive means and the voltage at input V a desired time interval for the charging of the gates of MOSFETs 12 and 13 to threshold voltage may be attained. An increase in the voltage at input V would, of course, tend to decrease such charging time and vice versa assuming that the resistance of such resistive means and the capacitance of the gates remains constant. However, it is difficult to provide appropriate resistive means on a MOSFET chip since additional process steps would be reqUired. Furthermore, the inclusion of MOSFET 11 enables a much smaller change in the voltage at input V to produce a useful change in the charging time. This is due to the fact that any change in such voltage will also change the on-resistance of MOSFET 11, since, as shown, the voltage at input V is connected both to the drain and to the gate of MOSFET 11. Therefore, an increase in the voltage at input V will decrease the on-resistance of MOSFET 11 resulting in a decrease in the RC time constant of the charging circuit and vice versa, thus giving increased effect to a change in voltage at input V. It will be understood that the voltage at input V could be a continuously varying voltage rather than a constant voltage, or it could be caused to change periodically in order to produce desired variations in the time duration of the pulses generated at the output of a circuit in accordance with this invention. The voltage at V must, of course, at least equal the threshold voltage of not only MOSFETs 12 and 13, but also of MOSFETs 14 and 18.

Thus, the gates of MOSFETs 12 and 13 may be caused to charge as indicated in FIG. 2 wherein it is assumed that the voltage at V is substantially equal to the threshold voltages of MOSFETs 12 and 13. MOSFET 13 may begin to conduct as its gate approaches threshold and it would thus tend to cause the voltage at V to charge the gate of MOSFET 14. Such charging of the gate of MOSFET 14 would have an RC time constant as indicated by a dotted line in FIG. 2, tending to introduce an undesirable time constant in the discharge of the capacitance 19 of the output line as also indicated by a dotted line in FIG. 2, but for the action of MOSFETs 12, 17 and 18 in accordance with this invention.

It will be seen that MOSFET 18 prevents the charging of the gate of MOSFET 14 so long as it remains enabled. However, the charging of the gate of MOSFET 12 toward threshold will cause it to conduct some current from voltage input V through MOSFET 17 to ground. As soon as such current flow begins the voltage at input V will tend to be divided across the resistances of MOSFETs 17 and 12, instead of appearing entirely across MOSFET 12. Thus the voltage on the gate of MOSFET 18 will be reduced by the amount of voltage developed by the current flow through the on-resistance of MOSFET 17. Such reduction in the voltage (or charge) on the gate of MOSFET 18 will tend to increase the resistance of MOSFET 18 as such voltage decreases from threshold thus increasing the voltage developed across MOSFET 18 and the voltage (or charge) on the gate of MOSFET 14. As the voltage on the gate of MOSFET 14 approaches threshold it will begin to discharge the capacitance 19 of the output line thus reducing the voltage thereon and on the gate of MOSFET 17. As the voltage on the gate of MOSFET 17 is reduced from threshold the resistance of MOSFET 17 will increase. Thus, it will be seen that the resistance of MOSFET 17 is increasing as the resistance of MOSFET 12 decreases resulting in a more rapid reduction in the voltage at the gate of MOSFET 18 which in turn increases the rate at which the gate of MOSFET 14 is charged toward threshold. The discharge of the capacitance 19 of the output line will therefore be increased, resulting in a further increase in the resistance of MOSFET 17 and the ratio thereof to the decreasing resistance of MOSFET 12.

From the above it will be seen that a regenerative or avalanche effect will occur when the voltages on the gates of MOSFETs 12 and 13 approach threshold resulting in rapid discharge of the output line as indicated. Such discharge may be made to approximate the trailing edge of a square wave by proper design of the circuit parameters. It will be understood that the discharge of the capacitance 19 of the output line through the on-resistance of MOSFET 14 will have its own RC time constant independent of the other elements of the circuit as represented at 20 in FIG. 2. Thus, the effect of the circuit of this invention is concentrated on the portion of the output discharge curve indicated at 21. These portions of the curve as well as the corresponding portions of the curves for other elements of the circuit have been exaggerated for better understanding of this invention and in an actual circuit may be made to approximate a square wave as nearly as does the charging of the capacitance 19 of output line for example. This may be accomplished by making proper adjustments in the ratios of the on-resistance of the various MOSFETs of the circuit with respect to each other. For example, if the on-resistance of MOSFET 12 is low with respect to the on-resistance of MOSFET 17 the regenerative effect and thus the sharpness of the termination of the pulse of increased time duration will be enhanced. Similarly, if the on-resistance of MOSFET 13 is low with respect to the on-resistance of MOSFET 18 the sharpness of the termination of the pulse of increased time duration will be enhanced by facilitation of the charging of the gate of MOSFET 14. The on-resistance of MOSFET 16 should be less than the on-resistance of MOSFET 11 in order to provide a rapid discharge of the gates of MOSFETs 12 and 13 in comparison to the charging thereof. The on-resistance of MOSFETs 14 and 15 should, of course, be as low as practical in order to enhance both the initiation and the termination of the pulse of increased time duration.

The above circuit may, of course, be formed on a metal oxide silicon chip together with other portions of the system in which it is used. Modification may, of course, be made in the circuit shown as suggested hereinabove. In addition, the circuit may be adapted to MOSFETs operating in the depletion mode. Other modifications of the circuit in accordance with this invention and falling within the scope of the following claims will be obvious to persons skilled in the art relating to metal oxide silicon field emission transistors.

What I claim is:

1. A MOSFET circuit for generating, from an electrical pulse of given time duration, a further electrical pulse of increased time duration comprising:

a. clock input means for said pulse of given time duration, output means for said pulse of increased time duration, and voltage input means;
b. a first pair of MOSFETs having their sources connected together and to said clock input means and their drains connected together and to said output means, the gate of one of said first pair of MOSFETs being connected to said clock input means;
c. a third MOSFET having its source connected to the gate of the other of said first pair of MOSFETs and its drain connected to said voltage input means, the gate of said third MOSFET being connected to said voltage input means through a resistive means;
d. a fourth MOSFET having its source connected to ground and its drain connected to the gate of said other of said first pair of MOSFETs;
e. a second pair of MOSFETs connected in series with the source of one of said second pair of MOSFETs connected to ground and the drain of the other of said second pair of MOSFETs connected to said voltage input, the common connection of said second pair of MOSFETs being connected to the gate of said fourth MOSFET, said one of said second pair of MOSFETs having its gate connected to said output line and said other of said second pair of MOSFETs having its gate connected to said voltage input means through a resistive means; and
f. a seventh MOSFET having its source connected to ground and its drain connected to said gate of said third MOSFET and to said gate of said other one of said second pair of MOSFETs, the gate of said seventh MOSFET being connected to said clock input means.

2. A circuit as claimed in claim 1 wherein said gate of said third MOSFET and said gate of said other one of said second pair of MOSFETs are connected together and to said voltage input through a common resistive means.

3. A circuit as claimed in claim 1 wherein said resistive means through which said gate of said third MOSFET is connected to said voltage input means includes a MOSFET having its gate connected to said voltage input means.

4. A circuit as claimed in claim 1 wherein said resistive means through which said gate of said other one of said second pair of MOSFETs is connected to said voltage input means includes a MOSFET having its gate connected to said voltage input means.

5. A circuit as claimed in claim 2 wherein the said common resistance means is adopted to change in value inversely with a change in voltage at said voltage input.

6. A circuit as claimed in claim 5 wherein said common resistive means is a MOSFET having its gate connected to said voltage input means.

7. A circuit for generating, from an electrical pulse of given time duration, a further electrical pulse of increased time duration, said circuit comprising:

a. input means for said pulse of given time duration and output means for said pulse of increased time duration;
b. a first MOSFET and a second MOSFET having their sources connected together and to said input means and their drains connected together and to said output means, the gate of said first MOSFET being connected to said input means;
c. charging means connected to the gate of said second MOSFET;

d. discharging means connected to said gate of said second MOSFET;

e. regenerative feedback means interconnecting said charging and said discharging means to enable said charging means to overpower said discharging means;

f. deactivation means connected to said input means for causing said charging means and said regenerative feedback means to be deactivated by said electrical pulse of given time duration;

g. activation means connected to said output means for causing said discharging means to be activated by said pulse of increased time duration; and h. time constant means for reactivating said charging means and said regenerative feedback means at a point in time after said electrical pulse of given duration has ended.

8. A circuit as claimed in claim 7 wherein said charging means comprises a voltage source connected to said gate of said second MOSFET through a third MOSFET the gate of which is connected to said voltage source through said time constant means.

9. A circuit as claimed in claim 7 wherein said discharging means comprises a further MOSFET connected between said gate of said second MOSFET and ground, the gate of said further MOSFET being connected to a voltage source through said activation means.

10. A circuit as claimed in claim 9 wherein said activation means comprises a still further MOSFET connected between said gate of said further MOSFET and said voltage source and having its gate connected to said output means.

11. A circuit as claimed in claim 10 wherein said regenerative feedback means comprises another MOSFET connected between said gate of said still further MOSFET and ground and having its gate connected to said voltage source through said time constant means.

12. A circuit as claimed in claim 7 wherein said deactivation means comprises yet another MOSFET connected between said charging means and ground and between said regenerative feedback means and ground, the gate of said yet another MOSFET being connected to said input means.

13. A circuit as claimed in claim 7 wherein said time constant means comprises a voltage source connected to said charging means and to said regenerative feedback means through a further MOSFET having its gate connected to said voltage source.